(12) United States Patent
Miller et al.

(10) Patent No.: US 7,589,945 B2
(45) Date of Patent: Sep. 15, 2009

(54) DISTRIBUTED ELECTROSTATIC DISCHARGE PROTECTION CIRCUIT WITH VARYING CLAMP SIZE

(75) Inventors: James W. Miller, Austin, TX (US); Melanie Etherton, Austin, TX (US); Michael G. Khazhinsky, Austin, TX (US); Michael Stockinger, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 313 days.

(21) Appl. No.: 11/513,638

(22) Filed: Aug. 31, 2006

(65) Prior Publication Data

US 2008/0062596 A1  Mar. 13, 2008

(51) Int. Cl.
*H02H 9/00* (2006.01)
(52) U.S. Cl. .................................... 361/56
(58) Field of Classification Search .............. 361/56
See application file for complete search history.

(56) References Cited

U.S. PATENT DOCUMENTS

| | | | |
|---|---|---|---|
| 4,385,337 A | 5/1983 | Asano et al. | |
| 5,034,845 A | 7/1991 | Murakami | |
| 5,237,395 A | 8/1993 | Lee | |
| 5,239,440 A | 8/1993 | Merrill | |
| 5,255,146 A | 10/1993 | Miller | |
| 5,287,241 A | 2/1994 | Puar | |
| 5,311,391 A | 5/1994 | Dungan et al. | |
| 5,361,185 A | 11/1994 | Yu | |
| 5,440,162 A | 8/1995 | Worley et al. | |
| 5,515,232 A | 5/1996 | Fukazawa et al. | |
| 5,559,659 A | 9/1996 | Strauss | |
| 5,610,790 A | 3/1997 | Staab et al. | |
| 5,654,862 A | 8/1997 | Worley et al. | |
| 5,683,918 A | 11/1997 | Smith et al. | |
| 5,773,326 A | 6/1998 | Gilbert et al. | |
| 5,917,207 A | 6/1999 | Colwell et al. | |
| 5,946,177 A | 8/1999 | Miller et al. | |
| 6,021,071 A * | 2/2000 | Otsuka | 365/189.05 |
| 6,268,286 B1 * | 7/2001 | Gauthier et al. | 438/655 |
| 6,327,126 B1 | 12/2001 | Miller et al. | |
| 6,385,021 B1 | 5/2002 | Takeda et al. | |

(Continued)

OTHER PUBLICATIONS

Merrill, Richard et al; "ESD Design Methodology"; EOS/ESD Symposium; National Semiconductor Fairchild Research Center.

(Continued)

*Primary Examiner*—Stephen W Jackson
*Assistant Examiner*—Ann T Hoang

(57) ABSTRACT

An integrated circuit includes a first I/O cell disposed at a substrate, the first I/O cell including a first electrostatic discharge (ESD) clamp transistor device. The first ESD clamp transistor device includes a control electrode, a first current electrode coupled to a first voltage reference bus, and second current electrode coupled to a second voltage reference bus. The first ESD clamp transistor device has a first channel width. The integrated circuit further includes a second I/O cell including a second ESD clamp transistor device. The second ESD clamp transistor device includes a control electrode, a first current electrode coupled to the first voltage reference bus, and second current electrode coupled to the second voltage reference bus. The second ESD clamp transistor device has a second channel width different than the first channel width.

18 Claims, 8 Drawing Sheets

U.S. PATENT DOCUMENTS

| | | | |
|---|---|---|---|
| 6,552,372 | B2 | 4/2003 | Wu et al. |
| 6,717,270 | B1 | 4/2004 | Downey et al. |
| 6,724,603 | B2 * | 4/2004 | Miller et al. ............... 361/111 |
| 6,879,476 | B2 | 4/2005 | Khazhinsky et al. |
| 6,900,970 | B2 | 5/2005 | Miller et al. |
| 6,970,336 | B2 | 11/2005 | Stockinger et al. |
| 2001/0017396 | A1 | 8/2001 | Miller, Jr. et al. |
| 2004/0027742 | A1 | 2/2004 | Miller et al. |
| 2004/0109270 | A1 | 6/2004 | Stockinger et al. |
| 2004/0141267 | A1 | 7/2004 | Khazhinsky et al. |
| 2004/0141268 | A1 | 7/2004 | Miller et al. |
| 2005/0078419 | A1 | 4/2005 | Stockinger et al. |
| 2005/0185351 | A1 | 8/2005 | Miller et al. |
| 2006/0028776 | A1 | 2/2006 | Stockinger et al. |
| 2006/0154469 | A1 | 7/2006 | Hess et al. |
| 2006/0181823 | A1 | 8/2006 | Miller et al. |

OTHER PUBLICATIONS

Anderson, Warren R. et al.; "Cross Referenced ESD Protection for Power Supplies"; EOS/ESD Symposium; Digital Equipment Corporation.

Juliano, Patrick A. et al.; "ESD Protection Design Challenges for a High Pin-Count Alpha Microprocessor in a 0.13 m CMOS SOI Technology"; EOS/ESD Symposium; Alpha Development Group, Hewlett-Packard Corp.; 2003.

Torres, Cynthia A. et al.; "Modular, Portable, and Easily Simulated ESD Protection Networks for Advanced CMOS Technologies"; Motorola, Inc.

Khazhinsky, Michael G. et al.; "ESD Protection for Advanced CMOS SOI Technologies"; Freescale Semiconductor, Inc.

Croft, Gregg D.; "Transient Supply Clamp with a Variable RC Time Constant"; EOS/ESD Symposium; Harris Semiconductor.

Worley, E.R. et al.; "Sub-Micron Chip ESD Protection Schemes Which Avoid Avalanching Junctions"; EOS/ESD Symposium; Rockwell Telecommunications.

Stockinger, Michael et al.; "Boosted and Distributed Rail Clamp Networks for ESD Protection in Advanced CMOS Technologies"; Motorola.

Miller, James W. et al.; "Comprehensive ESD Protection for Flip-Chip Products in a Dual Gate Oxide 65nm CMOS Technology"; Freescale Semiconductor, Inc.

Dabral, S. et al.; "Core Clamps for Low Voltage Technologies"; EOS/ESD Symposium; Intel Corporation, RN4-39.

International Search Report and Written Opinion correlating to PCT/US07/73679 dated Sep. 26, 2008.

* cited by examiner

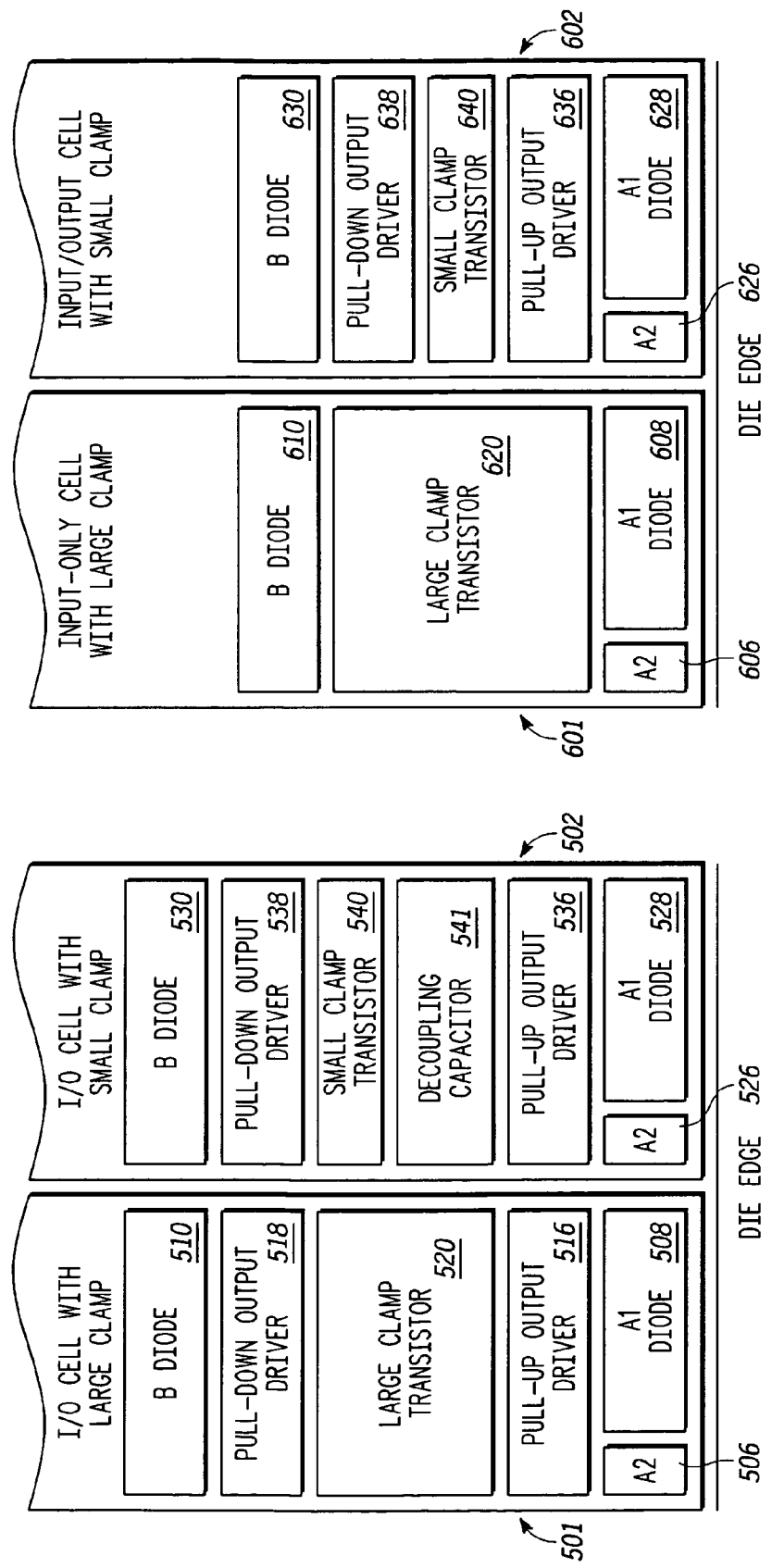

DISTRIBUTED ELECTROSTATIC DISCHARGE PROTECTION CIRCUIT WITH VARYING CLAMP SIZE

FIELD OF THE DISCLOSURE

The present disclosure is related generally to input/output (I/O) cells of integrated circuit devices and more particularly to electrostatic discharge (ESD) protection for input/output cells.

BACKGROUND

Design of robust electrostatic discharge (ESD) protection is important for integrated circuits in, for example, both wirebond and flip-chip packages. In an effort to protect the I/O cells in the I/O ring around the perimeter of an integrated circuit (IC) device, a designer often places ESD diodes between each I/O pad and the local I/O power ($V_{DD}$) and ground ($V_{SS}$) buses. In addition, active rail clamp circuits, comprising a transient detector circuit and a metal-oxide field-effect transistor (MOSFET) clamp, often are placed to provide ESD protection between the $V_{DD}$ and $V_{SS}$ buses. These clamp transistors, also referred to as "ESD clamp transistors", "clamp transistors," or simply "clamps," typically are distributed in parallel in power cells, ground cells, I/O cells or spacer cells in the I/O ring of the integrated circuit. The clamp transistors collectively form an ESD clamp transistor network. In some IC designs there are very few or no power/ground cells or spacer cells placed in the I/O ring. For example, in an IC designed for flip-chip packaging, off-chip connections to the $V_{DD}$ and $V_{SS}$ buses are typically made via bumps, without need for any power or ground cells in the I/O ring. Spacer cells require additional space in the I/O ring which is unfavorable, especially for designs with a large number of I/O cells. The implication for the ESD designer is that all ESD protection circuitry, including ESD clamp transistors, should ideally be contained within the I/O cells themselves. These ESD protection networks typically employ I/O cells with clamp transistors having the same relatively large channel width. This arrangement typically results in overprotection for the I/O cells on the interior of the I/O cell bank and underprotection for the I/O cells at the edges of the I/O cell bank, as well as excess current leakage by the ESD clamps. Accordingly, an improved ESD protection technique would be advantageous.

BRIEF DESCRIPTION OF THE DRAWINGS

The present disclosure may be better understood, and its numerous features and advantages made apparent to those skilled in the art by referencing the accompanying drawings.

FIG. 5 is a diagram illustrating circuit layouts of the I/O cells of FIG. 3 in accordance with at least one embodiment of the present disclosure.

FIG. 6 is a diagram illustrating additional circuit layouts of I/O cells in accordance with at least one embodiment of the present disclosure.

The use of the same reference symbols in different drawings indicates similar or identical items.

DETAILED DESCRIPTION OF THE DRAWINGS

Figure 1:
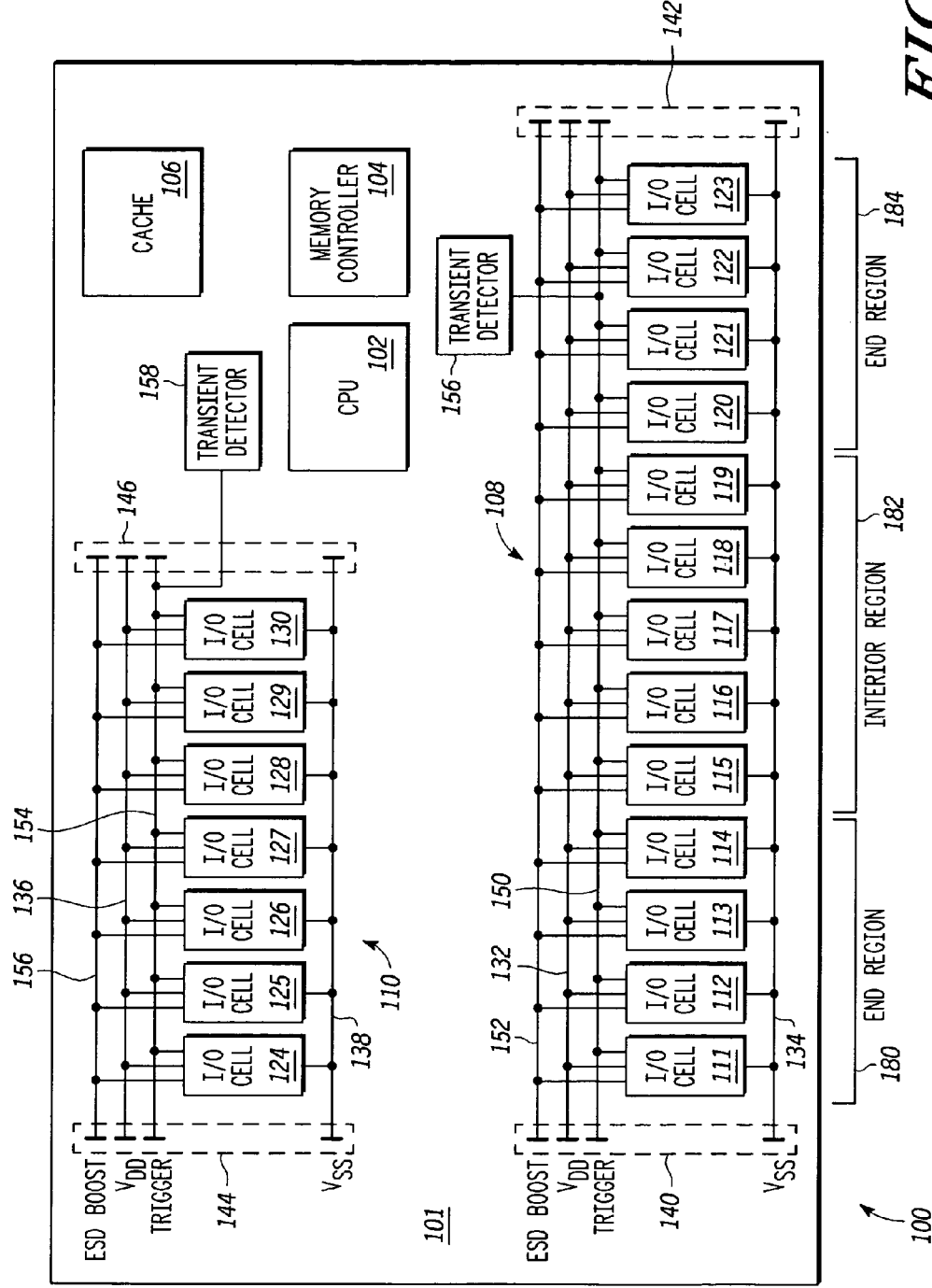
FIG. 1 is a diagram illustrating an exemplary IC device utilizing ESD protection for I/O cells in accordance with at least one embodiment of the present disclosure.

In accordance with one aspect of the present disclosure, an integrated circuit device includes a first voltage reference bus including a first terminating end and a second terminating end, and a second voltage reference bus. The integrated circuit device further includes a plurality of input/output (I/O) cells distributed along a length of the first voltage reference bus. Each of a first subset of the I/O cells includes a first electrostatic discharge (ESD) clamp transistor device, the first ESD clamp transistor device including a current electrode coupled to the first voltage reference bus and a current electrode coupled to the second voltage reference bus, wherein the first ESD clamp transistor device has a first channel width. Each of a second subset of the I/O cells includes a second ESD clamp transistor device including a current electrode coupled to the first voltage reference bus and a current electrode coupled to the second voltage reference bus, wherein the second ESD clamp transistor device has a second channel width, and wherein the second channel width is different than the first channel width.

In accordance with another aspect of the present disclosure, a bank of I/O cells includes a first I/O cell including a first electrostatic discharge (ESD) clamp transistor device. The first ESD clamp transistor device includes a control electrode, a first current electrode coupled to a first voltage reference bus, and second current electrode coupled to a second voltage reference bus. The first ESD clamp transistor device has a first channel width. The bank of I/O cells further includes a second I/O cell including a second ESD clamp transistor device. The second ESD clamp transistor device includes a control electrode, a first current electrode coupled to the first voltage reference bus, and second current electrode coupled to the second voltage reference bus. The second ESD clamp transistor device has a second channel width different than the first channel width.

In accordance with yet another aspect of the present disclosure, a method for compensating for electrostatic discharge (ESD) at an integrated circuit includes forming a first set of input/output (I/O) cells, wherein the first set represents a first portion of a bank of I/O cells and wherein each I/O cell of the first set includes a first ESD clamp transistor device including a current electrode coupled to a first voltage reference bus and a current electrode coupled to a second voltage reference bus. The first ESD clamp transistor device has a first channel width. The method further includes forming a second set of I/O cells, wherein the second set represents a second portion of the bank of I/O cells and wherein each I/O cell of the second set includes a second ESD clamp transistor device including a current electrode coupled to a first voltage reference bus and a current electrode coupled to a second voltage reference bus. The second ESD clamp transistor device has a second channel width different from the first channel width.

FIGS. 1-10 illustrate exemplary techniques for providing ESD protection in a bank of I/O cells of an IC device. The I/O cells are connected to a first voltage reference bus (e.g., a $V_{DD}$ bus) and a second voltage reference bus (e.g., a $V_{SS}$ bus), whereby the I/O cells are distributed between the terminating ends of the first voltage reference bus. In one embodiment, some or all of the I/O cells include an ESD clamp transistor device (e.g., a MOSFET transistor or an array of MOSFET transistors or transistor segments) having one current electrode connected to the first voltage reference bus and another current electrode connected to the second voltage reference bus, whereby the channel width of the ESD clamp transistor device of a particular I/O cell is based on the position of the I/O cell in the bank of I/O cells. To illustrate, the I/O cells proximal to the terminating ends of the first voltage reference bus can have ESD clamp transistor devices with larger channel widths than the I/O cells at the interior of the bank of I/O cells (i.e., distal from the terminating ends). With ESD clamp transistor devices of varying channel widths distributed in this manner, more uniform ESD protection levels can be achieved for the I/O cells of the bank.

The term "I/O," as used herein, refers to input, output, or a combination thereof. Accordingly, the term "I/O cell," as used herein, refers to any of an input-only cell, an output-only cell, or a cell configurable as both an input cell and an output cell. The term "transistor device," as used herein, refers to a single transistor or an array of transistors, wherein the single transistor or some or all of the transistors of an array of transistors can be implemented as a single-segment transistor or as a transistor comprising a plurality of segments (or "fingers"). Therefore, when referring to the channel width of a clamp transistor device, it should be understood that this represents the total, cumulative channel width of all the transistor segments that are wired in parallel to form the clamp transistor device.

For purposes of discussion, the ESD protection techniques of the present disclosure are illustrated in the context of a microprocessor. However, the ESD protection techniques can be similarly employed in other types of electronic devices, such as application specific integrated circuits (ASICs), microcontrollers, systems-on-a-chip (SOCs), and the like. Further, although the circuit implementations disclosed herein are illustrated using metal oxide semiconductor (MOS) transistors, such as silicon substrate and silicon on insulator MOS field effect transistors (MOSFETs), other transistor types, such as bipolar junction transistors, Multiple Independent Gate FETs (MIGFETs) and other materials, such as silicon germanium, can be implemented as appropriate without departing from the scope of the present disclosure. In addition, though the clamp transistor devices are illustrated herein as n-channel MOSFETs, other clamp devices, including p-channel MOSFETs, two or more series n-channel or p-channel MOSFETs, a bipolar junction transistor, or semiconductor controlled rectifiers (SCR) may be used without departing from the scope of the present disclosure.

Referring to FIG. 1, an exemplary integrated circuit (IC) 100 (e.g., a microprocessor) implementing ESD protection is illustrated in accordance with at least one embodiment of the present disclosure. In the illustrated example, the IC 100 includes a substrate 101, a central processing unit (CPU) 102 and a plurality of peripheral components, such as a memory controller 104 and a cache 106. The IC 100 further includes a plurality of input/output (I/O) cells to receive signals from, and provide signals to, components external to the IC 100. In the illustrated example, the plurality of I/O cells is implemented in an I/O cell bank 108 and in an I/O cell bank 110. The I/O cell bank 108 includes I/O cells 111-123 disposed at the substrate 101 and the I/O cell bank 110 includes I/O cells 124-130 disposed at the substrate 101.

The I/O cells 111-123 of the I/O cell bank 108 are connected to a first power domain represented by a $V_{DD}$ bus 132 and a $V_{SS}$ bus 134. The I/O cells 124-130 of the I/O cell bank 110 are connected to a separate second power domain represented by a $V_{DD}$ bus 136 and a $V_{SS}$ bus 138. The $V_{DD}$ bus 132 is terminated at terminating ends 140 and 142 while the $V_{DD}$ bus 136 is terminated at terminating ends 144 and 146, such that the $V_{DD}$ bus 132 and the $V_{DD}$ bus 136 are not continuous buses in IC 100 and constitute two separate power domains.

In the illustrated example, the I/O cells 111-123 are connected to a trigger bus 150 and an ESD boost bus 152, while I/O cells 124-130 are connected to a separate trigger bus 154 and ESD boost bus 156. Other embodiments, however, may not implement an ESD boost bus. In at least one embodiment, the I/O cells 111-123 of the I/O cell bank 108 are distributed (evenly or unevenly) along the length of the $V_{DD}$ bus 132 between the terminating end 140 and the terminating end 142 of the $V_{DD}$ bus 132, and the I/O cells 124-130 of the I/O cell bank 110 are distributed (evenly or unevenly) along the length of the $V_{DD}$ bus 136 between the terminating end 144 and the terminating end 146 of the $V_{DD}$ bus 136. In the illustrated embodiment, the $V_{SS}$ bus 134, ESD boost bus 152 and the trigger bus 150 are terminated at terminating ends 140 and 142 to match the $V_{DD}$ bus 132. Similarly, the $V_{SS}$ bus 138, the ESD boost bus 156 and the trigger bus 154 are terminated at terminating ends 144 and 146 to match the $V_{DD}$ bus 136. Alternately, the $V_{SS}$ bus 134 and the $V_{SS}$ bus 138 may be shorted together, thereby forming a continuous single $V_{SS}$ bus.

The IC 100 further includes a transient detector circuit 156 associated with the I/O bank 108 and a transient detector circuit 158 associated with the I/O bank 110. The transient detector circuit 156 has an output connected to trigger bus 150, and inputs (not shown) connected to the boost bus 152 and the $V_{SS}$ bus 134. The transient detector circuit 158 has a trigger output connected to the trigger bus 154, and inputs (not shown) connected to the boost bus 156 and the $V_{SS}$ bus 138. As illustrated, the transient detector circuits 156 and 158 can be remote, or separate, from the I/O cells which form I/O cell banks 108 and 110, respectively. Alternately, the transient detector circuit 156 can be implemented at one or more of the I/O cells 111-123 and the transient detector circuit 158 can be implemented at one or more of the I/O cells 124-130. Further, in another alternate embodiment, some or all of the I/O cells can include a separate transient detector circuit connected directly to a local ESD clamp transistor device.

As discussed with greater detail with reference to FIGS. 2-8, the channel width of the ESD clamp transistor device in a particular I/O cell of the I/O cell bank 108 is based on the position of the particular I/O cell within the I/O cell bank 108. Likewise, the channel width of the ESD clamp transistor device in a particular I/O cell of the I/O cell bank 110 is based on the position of the particular I/O cell within the I/O cell bank 110. In one embodiment, the channel width of an ESD clamp transistor device of an I/O cell is based on the proximity of the I/O cell to an edge of the I/O cell bank (or, alternately, a terminating end of the corresponding voltage reference bus). To illustrate, in one embodiment, the I/O cell bank 108 is divided into three regions: end region 180; interior region 182; and end region 184. In this example, the ESD clamp transistor devices of the I/O cells in the end regions 180 and 184 (i.e., I/O cells 111-114 and I/O cells 120-123) have a first channel width and the ESD clamp transistor devices of the I/O cells in the interior region 182 (i.e., I/O cells 115-119) have a second channel width less than the first channel width. The channel widths of the ESD clamp transistor devices in I/O cells 124-130 can be similarly configured for the I/O cell bank 110. In one embodiment, the first channel width is between 1.5 times and four times the second channel width. In another embodiment, the first channel width is between four times and ten times the second channel width.

Figure 2:
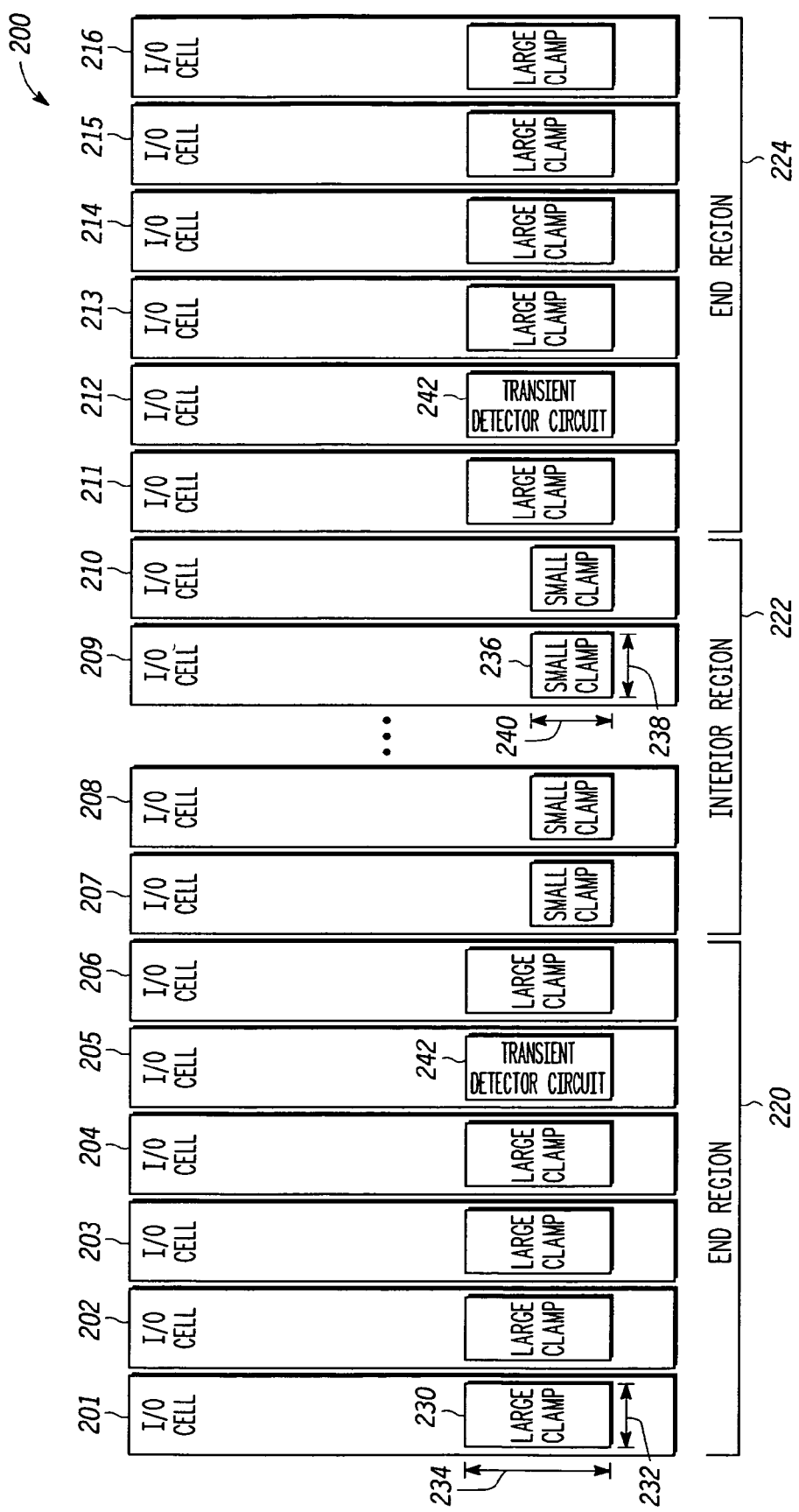
FIG. 2 is a diagram illustrating an exemplary bank layout of I/O cells having ESD clamp transistor devices with different channel widths in accordance with at least one embodiment of the present disclosure.
Figure 3:
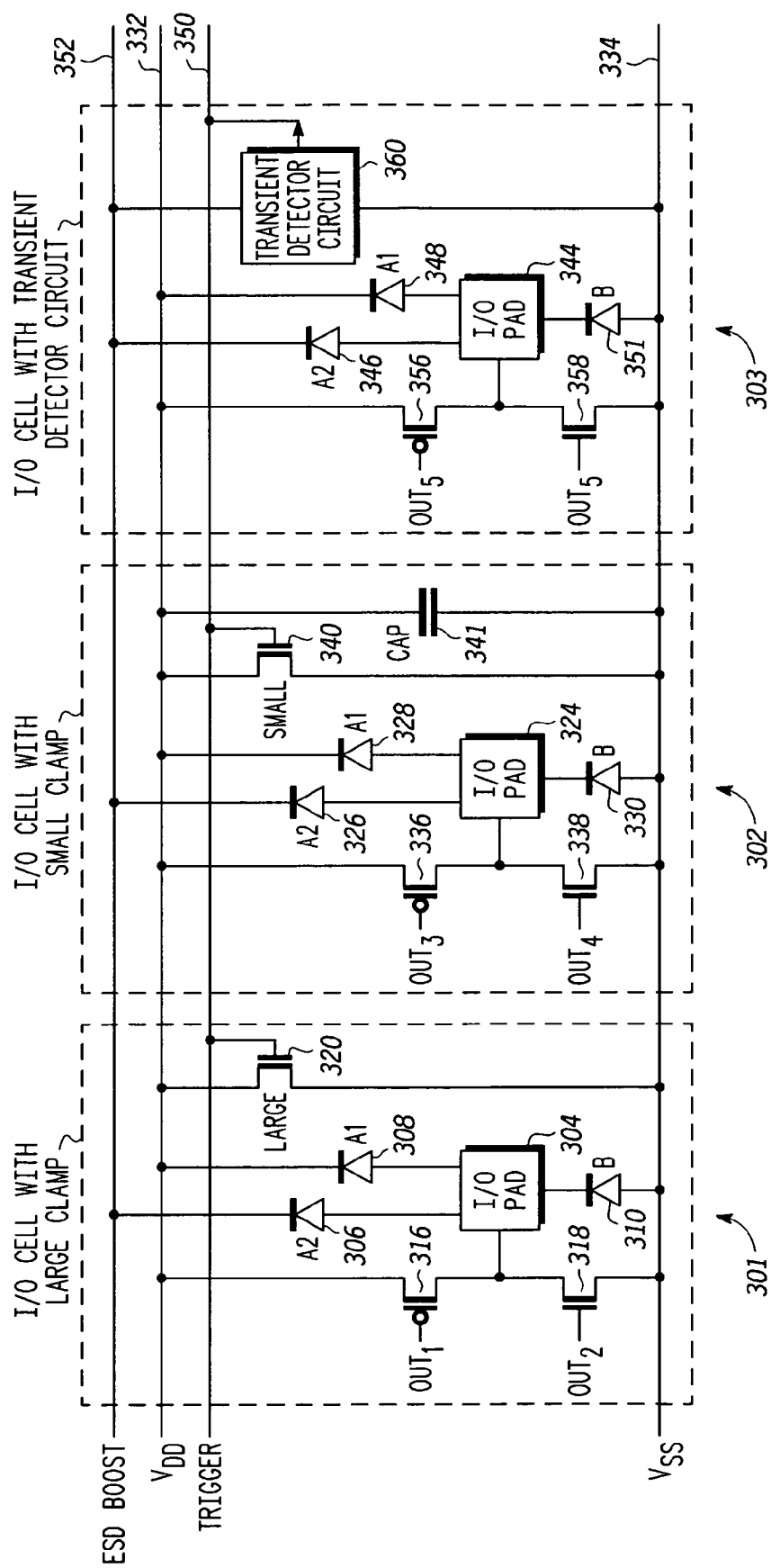
FIG. 3 is a circuit diagram illustrating certain I/O cells of FIG. 2 in accordance with at least one embodiment of the present disclosure.

Referring to FIG. 2, an exemplary layout floor plan of I/O cells of an I/O cell bank 200 (e.g., the I/O cell banks 108 and 110, FIG. 1) is illustrated in accordance with at least one embodiment of the present disclosure. For clarity, only the areas occupied by ESD clamp transistor devices and transient detector circuits are illustrated. In the illustrated example, the I/O cell bank 200 includes I/O cells 201-216, whereby I/O cells 201-206 are located at an end region 220 of the I/O cell bank 200, I/O cells 207-210 are located at an interior region 222 of the I/O cell bank 200, and I/O cells 211-216 are located at an end region 224 of the I/O cell bank 200. With the exception of I/O cell 205 and I/O cell 212, the I/O cells in the end regions 220 and 224 have ESD clamp transistor devices having a larger channel width (large clamp transistor devices) and the I/O cells of the interior region 222 have ESD clamp transistor devices having a smaller channel width (small clamp transistor devices). In place of an ESD clamp transistor device, the I/O cells 205 and 212 implement local transient detector circuits having outputs connected to a trigger bus (not shown) used to enable the ESD clamp transistor devices of the remaining I/O cells in response to detecting an ESD event. As illustrated in FIG. 2, the layout area 230 (as represented by layout height 234 and layout width 232) of the large clamp transistor devices is substantially greater than the layout area 236 (as represented by layout height 240 and layout width 238) of the small clamp transistor devices. As also illustrated, the large clamp transistor devices and the transient detector circuits are of about the same physical size and occupy about the same physical layout area of the floor plan of their respective I/O cells. For this reason, a design layout of a single base I/O cell may be created with nothing placed in this large clamp transistor device/transient detector circuit area. An I/O cell with large clamp transistor device or an I/O cell with transient detector circuit can be created from this base I/O cell by dropping in either a large clamp transistor device or transient detector circuit. Furthermore, an I/O cell with small clamp transistor device can also be created from this base I/O cell by dropping in a small clamp transistor device. In the I/O cell with small clamp transistor device, the unused remaining area can be utilized for decoupling capacitors or other I/O circuitry. This design approach, utilizing a base I/O cell floor plan with interchangeable large clamp transistor devices, small clamp transistor devices, or transient detector circuits can provide an efficient technique for implementing the ESD clamp network in an I/O library. Referring to FIG. 3, an exemplary circuit schematic of an I/O cell 301 having a large clamp transistor device (e.g., I/O cells 201-204, 206, 211, and 213-216, FIG. 2), an exemplary circuit schematic of an I/O cell 302 having a small clamp transistor device (e.g., I/O cells 207-210, FIG. 2) and an exemplary circuit schematic of an I/O cell 303 having a transient detector circuit (e.g., I/O cells 205 and 212, FIG. 2) are illustrated in accordance with at least one embodiment of the present disclosure. For purposes of clarity, the I/O cell schematics of FIG. 3 omit any additional I/O circuitry desired to be protected from ESD damage, such as, for example, input buffer circuitry, pre-driver circuitry, and other circuit components typically included for normal I/O operation.

The I/O cell 301 includes an I/O pad 304 connected to an ESD boost bus 352 (e.g., the ESD boost bus 152, FIG. 1) via a diode 306 (diode A2) and connected to a $V_{DD}$ bus 332 (e.g., the $V_{DD}$ bus 132, FIG. 1) via a diode 308 (diode A1), and whereby a $V_{SS}$ bus 334 (e.g., the $V_{SS}$ bus 134, FIG. 1) is connected to the I/O pad 304 via a diode 310 (diode B). I/O cell 301 further includes a large clamp transistor device 320 having a current electrode connected to the $V_{DD}$ bus 332, a current electrode connected to the $V_{SS}$ bus 334, and a control electrode connected to a trigger bus 350 (e.g., the trigger bus 150, FIG. 1). The I/O cell 301 further includes a pull-up output driver transistor 316 (e.g., a p-channel transistor) having a current electrode connected to the $V_{DD}$ bus 332, a current electrode connected to the I/O pad 304, and a control electrode to receive an $OUT_1$ signal from pre-driver circuitry (not shown). The I/O cell 301 also includes a pull-down output driver transistor 318 (e.g., an n-channel transistor) having a current electrode connected to the I/O pad 304, a current electrode connected to the $V_{SS}$ bus 334, and a control electrode to receive an $OUT_2$ signal from pre-driver circuitry (not shown).

The I/O cell 302 includes an I/O pad 324 connected to the ESD boost bus 352 via a diode 326 (A2 diode) and connected to the $V_{DD}$ bus 332 via a diode 328 (A1 diode), and whereby the $V_{SS}$ bus 334 is connected to the I/O pad 324 via a diode 330 (B diode). The I/O cell 302 further includes a small clamp transistor device 340 having a current electrode connected to the $V_{DD}$ bus 332, a current electrode connected to the $V_{SS}$ bus 334, and a control electrode connected to the trigger bus 350. The I/O cell 302 further includes a decoupling capacitor 341 with an anode terminal connected to the $V_{DD}$ bus 332 and a cathode terminal connected to the $V_{SS}$ bus 334. In an alternate embodiment, other I/O circuitry may be utilized in place of the coupling capacitor 341. The I/O cell 302 also includes a pull-up output driver transistor 336 (e.g., a p-channel transistor) having a current electrode connected to the $V_{DD}$ bus 332, a current electrode connected to the I/O pad 324, and a control electrode to receive an $OUT_3$ signal from pre-driver circuitry (not shown). The I/O cell 302 also includes a pull-down output driver transistor 338 (e.g., an n-channel transistor) having a current electrode connected to the I/O pad 324, a current electrode connected to the $V_{SS}$ bus 334, and a control electrode to receive an $OUT_4$ signal from pre-driver circuitry (not shown). For purposes of the illustrated example, the clamp transistor device 320 of the I/O cell 301 has a drawn channel width of 880 microns and a drawn channel length of 0.28 microns and the clamp transistor device 340 of the I/O cell 302 has a drawn channel width of 275 microns and a drawn channel length of 0.28 microns.

The I/O cell 303 includes an I/O pad 344 connected to the ESD boost bus 352 via a diode 346 (A2 diode) and connected to the $V_{DD}$ bus 332 via a diode 348 (A1 diode), and whereby the $V_{SS}$ bus 334 is connected to the I/O pad 344 via a diode 351 (B diode). The I/O cell 303 further includes a transient detector circuit 360 having an output connected to the ESD trigger bus 350. The transient detector circuit 360 also is connected to the ESD boost bus 352 and the $V_{SS}$ bus 334. The I/O cell 303 further includes a pull-up output driver transistor 356 (e.g., a p-channel transistor) having a current electrode connected to the $V_{DD}$ bus 332, a current electrode connected to the I/O pad 344, and a control electrode to receive an $OUT_5$ signal from pre-driver circuitry (not shown). The I/O cell 303 also includes a pull-down output driver transistor 358 (e.g., an n-channel transistor) having a current electrode connected to the I/O pad 344, a current electrode connected to the $V_{SS}$ bus 334, and a control electrode to receive an $OUT_6$ signal from pre-driver circuitry (not shown).

In the depicted example, the A2 diodes (diode 306 in the I/O cell 301, diode 326 in the I/O cell 302, and diode 346 in the I/O cell 303) each are formed as p+diffusion in NWELL diodes with a p+ active periphery of 40 microns. Similarly the A1 diodes (diode 308 in the I/O cell 301, diode 328 in the I/O cell 302, and diode 348 in the I/O cell 303) each are formed as p+ diffusion in NWELL diodes with a p+ active periphery of 400 microns. Finally, the B diodes (diode 310 in the I/O cell 301, diode 330 in the I/O cell 302, and diode 351 in the I/O cell 303) each are formed as n+ diffusion in PWELL diodes with an n+ active periphery of 400 microns. In other embodiments, other ESD diode active periphery values may be used, and these values may change from I/O cell to I/O cell.

During a positive ESD event applied, for example, to I/O pad 304 (ref. FIG. 3) in I/O cell 301, with respect to the $V_{SS}$ bus 334 grounded, the primary (high current) ESD path is through the forward-biased diode 308 to the $V_{DD}$ bus 332, then through each of the large clamp transistor device 320 and the small clamp transistor device 340 to the $V_{SS}$ bus 334. Significant voltage drops occur along this high current path at the A1 diode 308 and along the $V_{DD}$ bus such that the local voltage drop (Vds) across the drain to source terminals of each of the clamp transistor devices is often one half or less of the applied voltage at the stressed I/O pad 304 with respect to the grounded $V_{SS}$ bus 334. A secondary (low current) ESD path is through the forward biased diode 306 to the ESD boost bus 352, which powers the transient detector circuits, such as the transient detector 360. The transient detector circuits detect the large voltage change with time (dV/dt) on the ESD boost bus 352 associated with the ESD event and drive the large and small clamp transistor device gates to approximately the boost bus voltage via the trigger bus 350. Driving the clamp transistor device gates typically requires little current. Accordingly, due to the small ESD current routed along the ESD boost and trigger buses, there is a diode voltage drop (~0.8V) due to the diode 306, but relatively little IR voltage drop between the stressed I/O pad 304 and the gates of the clamp transistor devices 320 and 340. Indeed, it will be appreciated that the ESD boost bus 352 and the trigger bus 350 may be made relatively narrow and relatively resistive without imparting significant IR drop during ESD events. Therefore, due to the fact that the transient detector circuits are connected to the stressed I/O pad 304 via the low IR drop ESD boost bus 352, rather than the high IR drop $V_{DD}$ bus 332, the gate to source voltage (Vgs) for the multiple clamp transistor devices typically is greater than the drain to source voltage (Vds). The on-resistance of a clamp transistor device is approximately inversely proportional to Vgs under these bias conditions. This helps to increase the distributed clamp transistor device network performance and minimize the layout area required to implement robust ESD protection circuits of a given performance level. This "boosted" ESD clamp transistor device network can provide enhanced ESD protection as compared to non-boosted networks.

Figure 4:
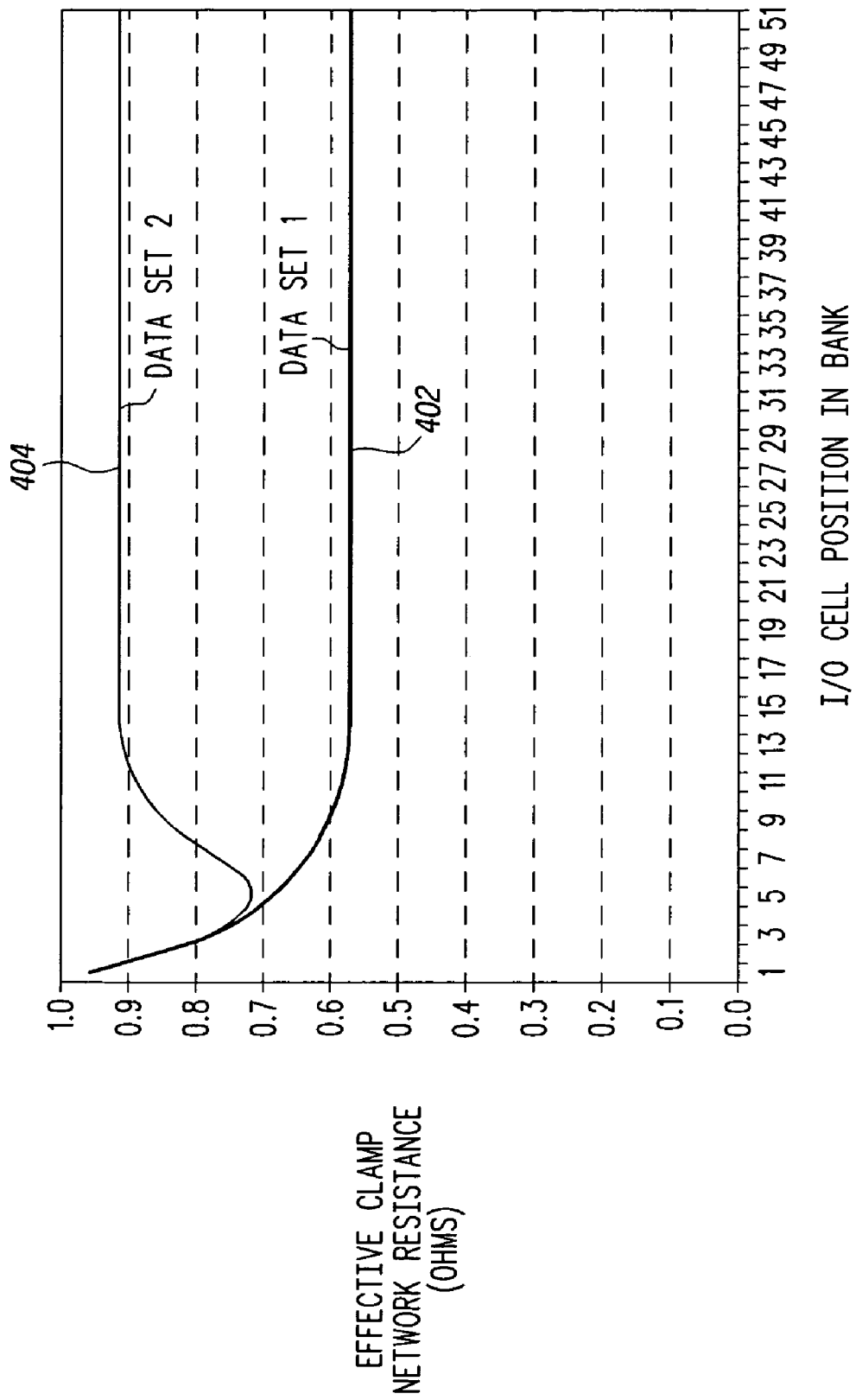
FIG. 4 is a graph illustrating an exemplary simulated performance of the embodiment shown in FIG. 2 and FIG. 3.

Referring to FIG. 4, an exemplary graph 400 of an exemplary comparison between an effective clamp network resistance of an I/O bank utilizing clamp transistor devices with varying channel widths in accordance with one embodiment of the present disclosure with an effective clamp network resistance of a conventional I/O bank utilizing clamp transistor devices having substantially equal channel widths is illustrated.

Distributing clamp transistor devices in the I/O cells of an I/O bank can provide efficient ESD protection since the clamp transistor devices, which are wired in parallel between a $V_{DD}$ bus and a $V_{SS}$ bus, can work together to dissipate the ESD currents. However, the resistance per unit length of the $V_{DD}$ and $V_{SS}$ buses as they extend across an I/O bank can strongly influence the clamp network performance. This bus resistance can vary from IC design to IC design depending on the width, number and thickness of metal layers allocated to the $V_{DD}$ and $V_{SS}$ buses. When performing SPICE simulations of ESD clamp transistor device network performance it is convenient to model the bus resistances with discrete incremental $V_{DD}$ and $V_{SS}$ bus resistors between each of the I/O cells in the bank. A typical value of incremental $V_{DD}$ or $V_{SS}$ bus resistance between I/O cells is 0.15 ohms.

As a first example of ESD network performance when clamp transistor devices are distributed along-resistive power buses, consider a conventional I/O bank having I/O cells with clamp transistor devices having equal channel widths. Further assume for this example that the conventional I/O bank comprises one hundred (100) I/O cells and where the clamp transistor device of each cell has a drawn channel width of 880 microns and a drawn channel length of 0.28 microns. Finally, assume that the transient detector circuits in the conventional I/O bank have detected an ESD event applied to the $V_{DD}$ bus locally to one of the I/O pads and in response drive the gates of multiple clamp transistor devices to the full voltage of an ESD boost bus, via a trigger bus.

As a second example of ESD network performance, consider an I/O bank having I/O cells with varying clamp transistor channel widths in accordance with at least one embodiment of the present disclosure. As with the conventional I/O bank example, assume that this I/O bank comprises one hundred (100) I/O cells and where the clamp transistor device of each I/O cell has a drawn channel length of 0.28 microns and a drawn channel width that depends on the position of the I/O cell within the I/O bank. For this example, the I/O cells at the interior region of the I/O bank have a drawn channel width of 275 microns and the I/O cells at the end regions of the I/O bank have a drawn channel width of 880 microns. For this example the end regions and interior regions were configured as shown in FIG. 2. Finally, as with the conventional I/O bank example, assume that the transient detector circuits in this I/O bank have detected an ESD event applied to the $V_{DD}$ bus locally to one of the I/O pads and in response drive the gates of multiple clamp transistor devices to the full voltage of an ESD boost bus, via a trigger bus.

A notable characteristic of these types of network is that the effective clamp network resistance to the local $V_{SS}$ bus varies when measured at different points along the $V_{DD}$ bus. This is illustrated by line 402 (data set 1) of FIG. 4 which plots the SPICE simulated effective clamp network resistance (the y-axis) to the local $V_{SS}$ bus measured on the $V_{DD}$ bus at each of I/O cells 1-50 (the x-axis) in the conventional I/O cell bank. Likewise, line 404 (data set 2) of FIG. 4 plots the SPICE simulated effective clamp network resistance (the y-axis) to the local $V_{SS}$ bus measured on the $V_{DD}$ bus at each of the I/O cells 1-50 (the x-axis) in the I/O cell bank having varying channel widths for the clamp transistor devices. The data for I/O cells 51-100 is not shown but matches the data for I/O cells 1-50 when mirrored about an axis between I/O cells 50 and 51.

As can be seen by line 402 of FIG. 4, with all clamp transistor devices in the conventional I/O bank equally sized, the effective clamp network resistance to the local $V_{SS}$ bus is minimum (about 0.58 ohms) when measured on the $V_{DD}$ bus in the centermost I/O cells in the interior region of the conventional I/O bank, and maximum (about 0.95 ohms) on the $V_{DD}$ bus in the two endmost I/O cells of the conventional I/O bank. Furthermore, the effective clamp network resistance to ground on the $V_{DD}$ bus drops rapidly in the first ten I/O cells when moving from the endmost I/O cells toward the center of the conventional I/O bank. For I/O cells further inboard in the conventional I/O bank, the effective clamp network resistance saturates at about 0.58 ohms.

The performance of the conventional I/O bank can be explained as follows. Because the clamp transistor devices of the conventional I/O bank are sized equally, each individual clamp transistor device has the same clamp resistance between the $V_{DD}$ bus and the $V_{SS}$ bus local to each clamp. However, the incremental $V_{DD}$ bus resistances and incremental $V_{SS}$ bus resistances between each clamp transistor device, and the point or points on the $V_{DD}$ and $V_{SS}$ buses where the ESD event is connected, prevent each clamp transistor device in the parallel network from participating equally. During an ESD event connected between the $V_{DD}$ bus and the $V_{SS}$ bus local to I/O cell 50 in FIG. 4, the clamp transistor device local to I/O cell 50 will see the highest drain to source voltage (Vds) and therefore move the highest ESD current of all the clamps in the bank. With a single I/O cell step to the right (I/O cell 51) or left (I/O cell 49) away from I/O cell 50, the local clamp transistor device sees a reduced Vds due to ESD current flow across the incremental $V_{DD}$ and $V_{SS}$ bus resistances between this I/O cell and I/O cell 50. With each additional I/O cell step to the right or left away from I/O cell 50, the local clamp transistor device sees a further reduced Vds due to ESD current flow across the additional incremental $V_{DD}$ and $V_{SS}$ bus resistances between this I/O cell and I/O cell 50. The result is that clamp transistor devices clustered about I/O cell 50 dissipate the majority of the ESD current with clamp transistor Vds, and therefore clamp transistor current, dropping off with increasing distance from I/O cell 50.

During an ESD event connected between the $V_{DD}$ bus and the $V_{SS}$ bus local to I/O cell 1 in the conventional I/O cell bank, the clamp transistor device local to I/O cell 1 will see the highest drain to source voltage (Vds) and therefore move the highest ESD current of all the clamps in the bank. However, unlike in the previous example, additional clamps may be only found to the right, not left, of I/O cell 1. This is the reason that the effective clamp network resistance to the local $V_{SS}$ bus is only 0.58 ohms on the $V_{DD}$ bus at I/O cell 51 but about 0.95 ohms on the $V_{DD}$ bus at I/O cells 1 and 100. Therefore, I/O cells near the center of the conventional I/O bank will be over-protected for ESD events, as compared to I/O cells near the ends of the bank, when distributing equally sized clamp transistor devices across a conventional I/O cell bank.

Further, in the conventional ESD network illustrated by line 402 in graph 400, it is assumed that the maximum allowed effective clamp network resistance between the $V_{DD}$ bus and the $V_{SS}$ bus local to any I/O cell is 0.95 ohms. Any higher effective clamp network resistance typically would result in damage to the IC. Therefore the clamp transistor devices were sized to meet this 0.95 ohms worst-case performance target. Unfortunately, as can be seen by line 402 of FIG. 4, this network is not ideal. Every I/O cell in the bank is over-protected, except for the two endmost I/O cells 1 and 100. Since ESD performance of an IC is typically quoted in terms of the weakest I/O cell, there is no added value in having over-protected I/O cells. Much of the clamp transistor size in the interior portions of the bank is wasted.

In contrast, the SPICE simulated effective clamp network resistance between the VDD bus and the VSS bus local to any I/O cell is much more uniform about the target of 0.95 ohms for the exemplary I/O bank having clamp transistor devices with variable channel widths, as illustrated by line 404 of graph 400. The effective clamp network resistance matches the target of 0.95 ohms at I/O cells 1 and 100, and drops in the first five I/O cells when moving from the endmost I/O cells toward the center of the bank, to about 0.7 ohms. However, the effective clamp network resistance rises again towards the 0.95 ohm target when moving further inboard in the I/O bank. Only about ten I/O cells near the ends of the bank are over-protected for ESD. All remaining I/O cells in the interior of the I/O bank exhibit effective clamp network resistance between the VDD bus and the VSS bus local to any I/O cell near the 0.95 ohm target. Therefore, as can be seen when comparing the effective clamp network resistance of a conventional I/O bank (line 402) with the effective clamp network resistance of an I/O bank having multiple clamp widths (line 404), it will be appreciated that the use of clamp transistor devices with different channel widths depending on position makes much more efficient use of the distributed clamp transistor devices than the I/O bank with clamp transistor devices having the same channel width.

Referring now to FIGS. 5 and 6, exemplary comparative circuit layouts for I/O cells having clamp transistor devices with different sizes (channel widths) are illustrated in accordance with at least one embodiment of the present disclosure. In the example of FIG. 5, the circuit layout 501 represents the circuit layout for an I/O cell having a clamp transistor device with a larger channel width (e.g., I/O cell 301, FIG. 3) and the circuit layout 502 represents the circuit layout for an I/O cell having an clamp transistor device with a smaller channel width (e.g., I/O cell 302, FIG. 3).

As illustrated in the context of the I/O cell 301 of FIG. 3, the circuit layout 501 includes layout areas 506, 508, 510, 516, 518 and 520 at which the circuitry for the diodes 306, 308 and 310, the pull-up output driver transistor 316, the pull-down output driver transistor 318 and the clamp transistor device 320 are respectively implemented. As also illustrated in the context of the I/O cell 302 of FIG. 3, the circuit layout 502 includes layout areas 526, 528, 530, 536, 538, 540 and 541 at which the circuitry for the diodes 326, 328 and 330, the pull-up driver transistor 336, the pull-down driver transistor 338, the clamp transistor device 340, and the decoupling capacitor 341 are respectively implemented.

In the illustrated example, the diodes and the pull-up and pull-down output driver transistors configurations are the same for both the I/O cell 301 and the I/O cell 302, and therefore layout areas 526, 528, 530, 536 and 538 of the circuit layout 502 can be in the same corresponding layout location and have the same corresponding layout area as the corresponding layout areas 506, 508, 510, 516 and 518 of the circuit layout 501. However, because the size (channel width) of the clamp transistor device 320 of the I/O cell 301 is larger than the size (channel width) of the clamp transistor device 340 of the I/O cell 302, the layout area 520 of the circuit layout 501 for the clamp transistor device 320 consequently is larger than the layout area 540 of the circuit layout 502 for the clamp transistor device 340. The extra layout area (layout area 541) afforded by the use of the smaller channel width for the ESD clamp transistor device 340 allows additional cell circuit components to be implemented in the circuit layout 502.

In the illustrated embodiment, layout area 541 is used to implement the decoupling capacitor 341. For many IC applications, decoupling capacitors connected between the $V_{DD}$ bus and the $V_{SS}$ bus are highly desirable as a way to reduce simultaneous switching noise during normal operation. In other embodiments, area 541 of the circuit layout 502 may be used for other purposes, such as, for example, additional I/O circuitry. As described previously, circuit layout 501 and circuit layout 502 may be easily created from a single base I/O cell layout design by interchangeably placing either the large clamp transistor device 320, or the combined small clamp transistor device 340 and decoupling capacitor 341 in the available space.

In the example of FIG. 6, the circuit layout 601 represents the circuit layout of an input-only type I/O cell and the circuit layout 602 represents the circuit layout of an I/O cell having both input and output capabilities. The circuit layout 601 includes a layout area 606 for implementing a diode between the I/O pad (not shown) and an ESD boost bus, a layout area 608 for implementing a diode between the I/O pad and a $V_{DD}$ bus, and a layout area 610 for implementing a diode between a $V_{SS}$ bus and the I/O pad. The circuit layout 601 further includes a layout area 620 for implementing an ESD clamp transistor device having a larger channel width. The circuit layout 602 includes a layout area 626 for implementing a diode between the I/O pad (not shown) and an ESD boost bus, a layout area 628 for implementing a diode between the I/O pad and a $V_{DD}$ bus, and a layout area 630 for implementing a diode between a $V_{SS}$ bus and the I/O pad. The circuit layout 602 further includes a layout area 636 for implementing a pull-up driver transistor, a layout area 638 for implementing a pull-down driver transistor, and a layout area 640 for implementing an ESD clamp transistor device having a smaller channel width.

As illustrated the comparative sizes of the layout areas 620 and 640 of FIG. 6, the input-only type cell represented by the circuit layout 601 can implement an ESD clamp transistor device having a larger channel width than the full I/O cell represented by the circuit layout 602 due to the additional layout areas 636 and 638 used in the circuit layout 602 for the pull-up driver transistor and the pull-down driver transistor. Thus, in one embodiment, the total layout area of the ESD clamp transistor device, pull-down driver transistor, and pull-up driver transistors (e.g., the total of the layout areas 640, 636, and 638) of the circuit layout 602 is not substantially larger than the layout area 620 for the ESD clamp transistor device of the circuit layout 601 so as to facilitate ease of design and interchangeability between the circuit layout 601 and the circuit layout 602.

Figure 7:
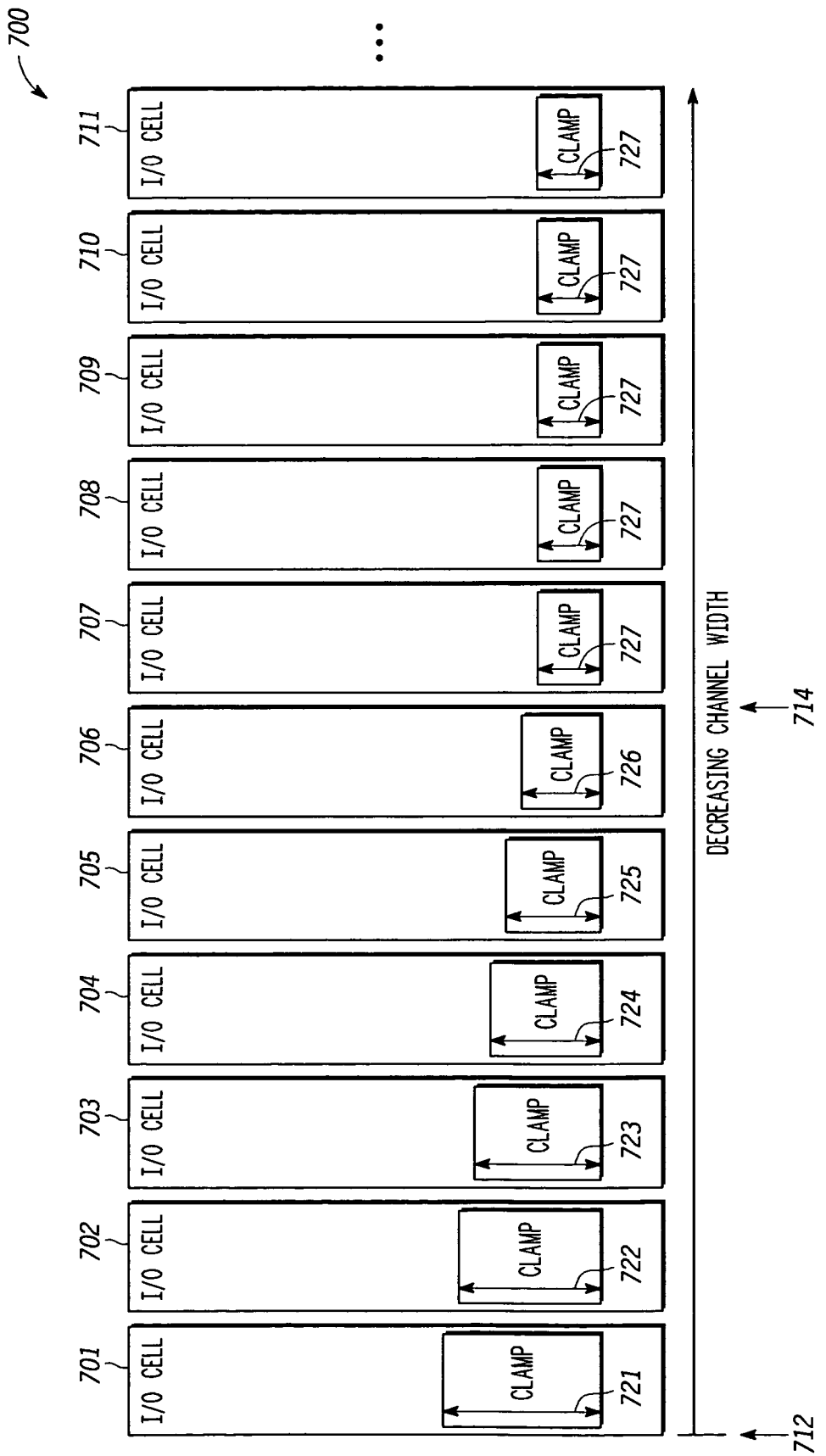
FIGS. 7-8 are diagrams illustrating additional exemplary bank layouts of I/O cells having ESD clamp transistor devices with different channel widths in accordance with at least one embodiment of the present disclosure.

Referring to FIG. 7, another exemplary layout floor plan of I/O cells of an I/O cell bank 700 is illustrated in accordance with at least one embodiment of the present disclosure. In the depicted example, the I/O cell bank 700 includes a plurality of I/O cells, including I/O cells 701-711 positioned starting at bank edge 712. The ESD clamp transistor devices of I/O cells 701-706 occupy layout areas 721-726, respectively, in the I/O cell floor plans. The ESD clamp transistor devices of I/O cells 707-711 each occupy a layout area 727. Additional I/O cells, similar to I/O cells 707-711, are assumed placed to the right of I/O cell 711, as indicated by the three dots in FIG. 7. It should be understood that the ESD clamp transistor devices differ in layout area because they vary in channel width. The channel length for each ESD clamp transistor device is assumed constant.

In the illustrated example, layout area 721 is greater than layout area 722, layout area 722 is greater than layout area 723, layout area 723 is greater than layout area 724, layout area 724 is greater than layout area 725, layout area 725 is greater than layout area 726, and layout area 726 is greater than layout area 727. Thus, it will be appreciated that the layout area, and therefore channel width of the ESD clamp transistor device implemented in an I/O cell decreases the more distal the I/O cell is from the bank edge 712 up to point 714, after which the channel width of the ESD clamp transistor devices is kept relatively constant for the I/O cells. It therefore also will be appreciated that, when the clamp transistor devices are each sized correctly, the variation of the channel widths for the clamp transistor devices can allow for more uniform ESD protection in the I/O cell bank 700. The ESD clamp transistor device network of FIG. 7, with multiple clamp transistor sizes can allow for even more uniform protection than can be achieved with only two different clamp transistor sizes.

Figure 8:
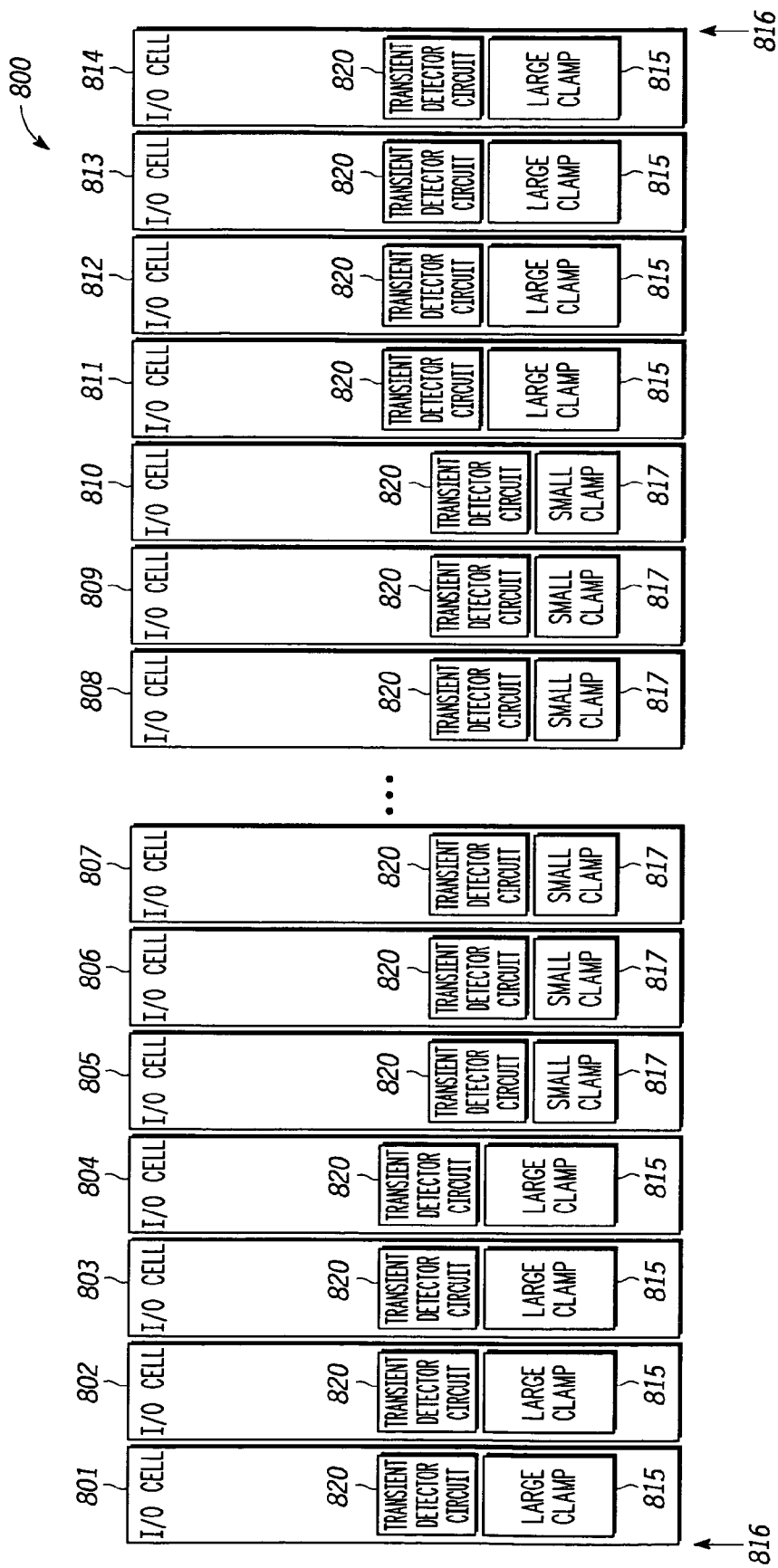

Referring to FIG. 8, yet another exemplary layout of I/O cells of an I/O cell bank 800 is illustrated in accordance with at least one embodiment of the present disclosure. In the depicted example, the I/O cell bank 800 includes a plurality of I/O cells, including I/O cells 801-814, positioned between bank edge 816 and bank edge 818. In the depicted example, the I/O cells at the edge regions (i.e., I/O cells 801-804 and I/O cells 811-814) include ESD clamp transistor devices 815 having larger channel widths and the I/O cells at the interior region (i.e., I/O cells 805-810) include ESD clamp transistor devices 817 having smaller channel widths. Further, in one embodiment, each of the I/O cells 801-814 includes a transient detection circuit 820 having a trigger output to enable the ESD clamp transistor device of the corresponding I/O cell in response to an ESD event at the I/O cell. One difference between I/O cell bank 800 in FIG. 8 and I/O cell bank 200 in FIG. 2 is that the clamp transistor devices in I/O cell bank 800 are driven by local transient detector circuits during an ESD event, while the clamp transistor devices in I/O cell bank 200 are driven by transient detector circuits placed in another I/O cell. However, in both I/O bank 200 and I/O bank 800 the I/O cells proximal to the edge regions of the bank have clamp transistor devices with larger channel widths than the I/O cells at the interior region of the bank (i.e., distal from the terminating ends). The three dots in between I/O cells 807 and 808 in FIG. 8 illustrate that additional I/O cells may optionally be placed in interior region of I/O bank 800.

Figure 9:
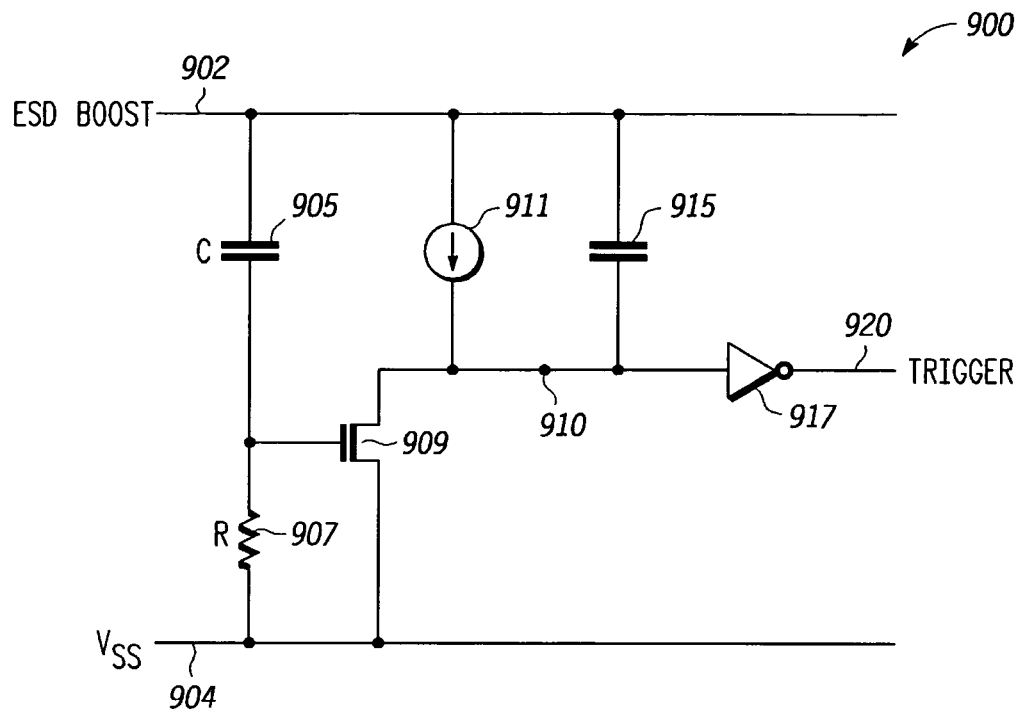
FIG. 9 is a circuit diagram illustrating an exemplary prior-art transient detection circuit for ESD protection.

Referring to FIG. 9, an exemplary prior-art transient detector circuit 900 is illustrated. Although the transient detector circuit 900 illustrates one suitable implementation, any of a variety of transient detector circuits may be used to detect ESD events and provide a trigger signal in response without departing from the scope of the present disclosure. The transient detector circuit 900 can be implemented as, for example, the transient detector circuit 156 of FIG. 1 located remotely relative of a monitored I/O cell bank, the transient detector circuit 242 of FIG. 2 placed in a subset of the I/O cells in the bank, or the transient detector circuit 820 of FIG. 8 placed local to the clamp transistor device in each I/O cell.

Transient detector circuit 900 includes an RC circuit of capacitive element 905 and resistive element 907 for detecting a dV/dt transient on the boost bus 902 in the ESD range. If the voltage rise time is sufficiently short (e.g., 60 ns or less), the transistor 909 is turned on long enough to pull node 910 down to the voltage of the $V_{SS}$ bus 904 (logic level low). The inverter 917 then outputs a voltage equal to the boost bus 902 (logical level high) on to trigger bus 920 to turn on the clamp transistor devices (e.g., the clamp transistor device 320, FIG. 3). The current source 911 and the capacitive element 915 act as a delay-on circuit for holding the input of the inverter 917 low for a period of time appropriate to fully discharge the ESD event (e.g., typically 300-600 ns).

In one embodiment, transient detector circuit 900 includes a $V_{DD}$ boost circuit (not shown in FIG. 9). A $V_{DD}$ boost circuit may be used to increase the boost bus voltage to the voltage applied to the $V_{DD}$ bus during a positive ESD event applied directly to the $V_{DD}$ bus. The boost circuit may include a voltage comparator circuit and if the voltage of the $V_{DD}$ bus exceeds the boost bus during an ESD event, the boost circuit pulls the boost bus up to the voltage of the $V_{DD}$ bus.

It will be appreciated that FIG. 9 illustrates one type of transient detector circuit that may be implemented in the ESD protection networks described herein. This transient detector circuit may also be used for non-boosted ESD clamp transistor device networks by powering the transient detector circuit with the $V_{DD}$ bus rather than the boost bus (i.e., the boost bus is merged with the $V_{DD}$ bus). Other types of ESD detecting trigger circuits may be implemented without departing from the scope of the present disclosure.

Figure 10:
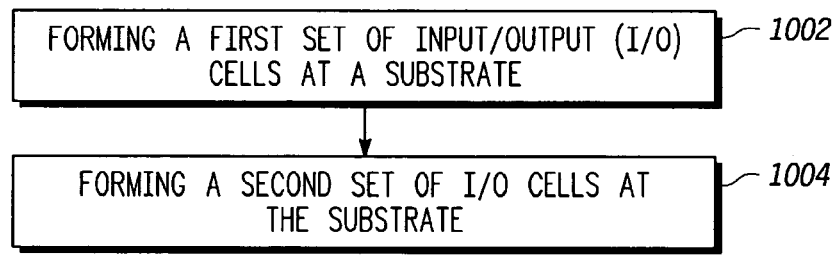
FIG. 10 is a flow diagram illustrating an exemplary method for compensating for ESD at an integrated circuit (IC) device in accordance with at least one embodiment of the present disclosure.

Referring to FIG. 10, an exemplary method 1000 for compensating for electrostatic discharge (ESD) at an integrated circuit is illustrated in accordance with at least one embodiment of the present disclosure. The method 1000 includes forming a first set of input/output (I/O) cells at a substrate at block 1002. The first set represents a first portion of a bank of I/O cells. Each I/O cell of the first set includes a first ESD clamp transistor device having a current electrode connected to a first voltage reference bus, a current electrode connected to a second voltage reference bus, whereby the first ESD clamp transistor device has a first channel width. The method 1000 further includes forming a second set of I/O cells at the substrate at block 1004. The second set of I/O cells can be formed concurrently with the first set of I/O cells. The second set represents a second portion of the bank of I/O cells. Each I/O cell of the second set includes a second ESD clamp transistor device having a current electrode connected to a first voltage reference bus, a current electrode connected to a second voltage reference bus. The second ESD clamp transistor device has a second channel width different from the first channel width. In one embodiment, the first channel width is based on a position of the first set within the bank of I/O cells and the second channel width is based on a position of the second set within the bank of I/O cells. The first portion can include an end region of the bank of I/O cells, the second portion can include an interior region of the bank of I/O cells, and the first channel width is greater than the second channel width.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. An integrated circuit comprising:
a first voltage reference bus comprising a first terminating end and a second terminating end;
a second voltage reference bus;
a plurality of input/output (I/O) cells distributed along a length of the first voltage reference bus and comprising:
a first subset of I/O cells disposed proximal to one of the first terminating end or the second terminating end of the first voltage reference bus; and
a second subset of I/O cells disposed distal from the first terminating end and the second terminating end of the first voltage reference bus; and
wherein each of the first subset of the I/O cells comprises a first electrostatic discharge (ESD) clamp transistor device, the first ESD clamp transistor device comprising a current electrode coupled to the first voltage reference bus and a current electrode coupled to the second voltage reference bus, wherein the first ESD clamp transistor device comprises a first channel width; and
wherein each of the second subset of the I/O cells comprises a second ESD clamp transistor device comprising a current electrode coupled to the first voltage reference bus and a current electrode coupled to the second voltage reference bus, wherein the second ESD clamp transistor device comprises a second channel width, and wherein the second channel width is less than the first channel width.

2. The integrated circuit of claim 1, further comprising:
a transient detector circuit having an output coupled to a trigger bus; and
wherein a control electrode of the first ESD clamp transistor device of each of the first subset of I/O cells and a control electrode of the second ESD clamp transistor device of each of the second subset of the I/O cells is coupled to the trigger bus.

3. The integrated circuit of claim 1, wherein the first channel width is at least twice the second channel width.

4. The integrated circuit of claim 1, wherein each of a third subset of the I/O cells comprises a third ESD clamp transistor device comprising a current electrode coupled to the first voltage reference bus and a current electrode coupled to the second voltage reference bus, wherein the third ESD clamp transistor device comprises a third channel width, and wherein the third channel width is different than the first channel width and the second channel width.

5. The integrated circuit of claim 4, wherein:
the third subset of the I/O cells comprises I/O cells disposed between the first subset and the second subset; and
the first channel width is greater than the third channel width, and the third channel width is greater than the second channel width.

6. The integrated circuit of claim 1, wherein:
each of a third subset of the I/O cells comprises a transient detector circuit having an output coupled to at least one corresponding ESD clamp transistor device of at least one I/O cell of the first subset or the second subset; and
wherein the I/O cells of the third subset are disposed among the I/O cells of the first subset and the second subset.

7. The integrated circuit of claim 1, wherein:
a first I/O cell of the second subset of I/O cells comprises a cell circuit component; and
a total layout area of the ESD clamp transistor device and the cell circuit component of the first I/O cell is not substantially greater than a total layout area of the first ESD clamp transistor device.

8. The integrated circuit of claim 7, wherein the cell circuit component comprises at least one of output driver circuitry, a decoupling capacitor, or a transient detector circuit.

9. A bank of input/output (I/O) cells comprising:
a first I/O cell comprising a first electrostatic discharge (ESD) clamp transistor device comprising a control electrode, a first current electrode coupled to a first voltage reference bus, and second current electrode coupled to a second voltage reference bus, the first ESD clamp transistor device having a first channel width, and wherein the first I/O cell positioned at an end region of the bank of I/O cells; and
a second I/O cell comprising a second ESD clamp transistor device comprising a control electrode, a first current electrode coupled to the first voltage reference bus, and second current electrode coupled to the second voltage reference bus, the second ESD clamp transistor device having a second channel width different less than the first channel width, and wherein the second I/O cell is positioned at an interior region of the bank of I/O cells.

10. The bank of I/O cells of claim 9, wherein the first channel width is at least twice the second channel width.

11. The bank of I/O cells of claim 9, wherein:
   the second I/O cell comprises a cell component disposed adjacent to the second ESD clamp transistor device;
   the first ESD clamp transistor device is disposed at a first position of the first I/O cell and the second ESD clamp transistor device and the cell component are disposed at a second position of the second I/O cell, the second position corresponding to the first position; and
   a combined layout area of the second ESD clamp transistor device and the cell component is not substantially larger than a layout area of the first ESD clamp transistor device.

12. The bank of I/O cells of claim 11, wherein a total layout area of the first I/O cell is substantially equal to a total layout area of the second I/O cell.

13. The bank of I/O cells of claim 11, wherein the cell component comprises output driver circuitry.

14. The bank of I/O cells of claim 11, wherein the cell component comprises a transient detector circuit comprising an output coupled to a control electrode of the second ESD clamp transistor device.

15. A method for compensating for electrostatic discharge (ESD) at an integrated circuit, the method comprising:
   forming a first set of input/output (I/O) cells, wherein the first set represents an end region of a bank of I/O cells and wherein each I/O cell of the first set comprises a first ESD clamp transistor device comprising a current electrode coupled to a first voltage reference bus and a current electrode coupled to a second voltage reference bus, the first ESD clamp transistor device having a first channel width; and
   forming a second set of I/O cells, wherein the second set represents an interior region of the bank of I/O cells and wherein each I/O cell of the second set comprises a second ESD clamp transistor device comprising a current electrode coupled to the first voltage reference bus and a current electrode coupled to the second voltage reference bus, the second ESD clamp transistor device having a second channel width less than the first channel width.

16. The method of claim 15, wherein the first channel width is based on a position of the first set within the bank of I/O cells and the second channel width is based on a position of the second set within the bank of I/O cells.

17. The method of claim 15, wherein the first channel width is at least twice the second channel width.

18. The method of claim 15, further comprising:
   forming a third set of I/O cells, wherein the third set represents a third portion of the bank of I/O cells and wherein each I/O cell of the third set comprises a third ESD clamp transistor device comprising a current electrode coupled to the first voltage reference bus and a current electrode coupled to the second voltage reference bus, the third ESD clamp transistor device having a third channel width different from the first channel width and the second channel width.

* * * * *

UNITED STATES PATENT AND TRADEMARK OFFICE
CERTIFICATE OF CORRECTION

PATENT NO.        : 7,589,945 B2                                                Page 1 of 1
APPLICATION NO.   : 11/513638
DATED             : September 15, 2009
INVENTOR(S)       : James Miller et al.

It is certified that error appears in the above-identified patent and that said Letters Patent is hereby corrected as shown below:

Column 14, Line 54, please change "first I/O cell positioned at an end" to --second I/O cell is positioned at an interior--

Column 14, Line 61, please delete "different"

Signed and Sealed this
Thirty-first Day of May, 2011

David J. Kappos
*Director of the United States Patent and Trademark Office*